(12) United States Patent
Sakata (10) Patent No.: US 10,040,276 B2
(45) Date of Patent: Aug. 7, 2018

(54) ROTARY SCREEN PRINTER

(71) Applicant: KOMORI CORPORATION, Tokyo (JP)

(72) Inventor: Yoshihisa Sakata, Tsukuba (JP)

(73) Assignee: KOMORI CORPORATION, Tokyo (JP)

(*) Notice: Subject to any disclaimer, the term of this patent is extended or adjusted under 35 U.S.C. 154(b) by 0 days.

(21) Appl. No.: 15/520,938

(22) PCT Filed: Oct. 21, 2015

(86) PCT No.: PCT/JP2015/079623
§ 371 (c)(1),
(2) Date: Apr. 21, 2017

(87) PCT Pub. No.: WO2016/063890
PCT Pub. Date: Apr. 28, 2016

(65) Prior Publication Data
US 2017/0341366 A1 Nov. 30, 2017

(30) Foreign Application Priority Data
Oct. 23, 2014 (JP) .................................. 2014-216231

(51) Int. Cl.
*B41F 15/42* (2006.01)
*B41F 15/08* (2006.01)
(Continued)

(52) U.S. Cl.
CPC .......... *B41F 15/0809* (2013.01); *B41F 11/02* (2013.01); *B41F 15/42* (2013.01); *B41N 10/005* (2013.01); *H05K 2203/0139* (2013.01)

(58) Field of Classification Search
None
See application file for complete search history.

(56) References Cited

U.S. PATENT DOCUMENTS 4,509,454 A * 4/1985 Vertegaal ................ B41F 17/00
101/119
5,323,700 A 6/1994 Katsuyama et al.
(Continued)

FOREIGN PATENT DOCUMENTS

EP 1 582 349 A1 10/2005
EP 2 835 258 A2 2/2015
(Continued)

OTHER PUBLICATIONS

Extended European Search Report dated Mar. 9, 2018 in the corresponding EP Application No. 15852426.4.

*Primary Examiner* — Jill Culler
(74) *Attorney, Agent, or Firm* — Birch Stewart Kolasch & Birch, LLP (57) ABSTRACT

A rotary screen printing press is provided with a screen-cylinder throw-on/off motor encoder (231) that detects the position of a screen cylinder (201), a squeegee throw-on/off motor encoder (232) that detects the position of a squeegee (221), and a control unit (300) that controls screen cylinder throw-on/off motors (209) and squeegee throw-on/off motors (224) based on the position of the screen cylinder (201) detected by the screen-cylinder throw-on/off motor encoder (231) and the position of the squeegee (221) detected by the squeegee throw-on/off motor encoder (232) so that the squeegee (221) may not contact a screen plate (201A) except when the screen plate (201A) is in contact with an impression cylinder (100).

2 Claims, 7 Drawing Sheets (51) Int. Cl.
*B41F 11/02* (2006.01)
*B41N 10/00* (2006.01)

(56) References Cited

U.S. PATENT DOCUMENTS

| | | | |
|---|---|---|---|
| 5,671,671 A | 9/1997 | Wyssmann et al. | |
| 6,412,407 B1 * | 7/2002 | Brocker | B41F 15/0809 |
| | | | 101/116 |
| 8,714,083 B2 * | 5/2014 | Numauchi | B41F 15/0809 |
| | | | 101/116 |
| 9,327,491 B2 * | 5/2016 | Kusaka | B41F 15/44 |
| 2007/0193462 A1 | 8/2007 | Schaede | |

FOREIGN PATENT DOCUMENTS

| | | |
|---|---|---|
| EP | 2 848 406 A2 | 3/2015 |
| JP | 5-221109 A | 8/1993 |
| JP | 2000-117934 A | 4/2000 |
| JP | 2005-219509 A | 8/2005 |
| JP | 2007-530324 A | 11/2007 |
| JP | 2009-160938 A | 7/2009 |
| JP | 4885840 B2 | 2/2012 |
| JP | 5337358 B2 | 11/2013 |
| JP | 2014-100819 A | 6/2014 |
| WO | WO 2005/095109 A1 | 10/2005 |

* cited by examiner

ROTARY SCREEN PRINTER

TECHNICAL FIELD

The present invention relates to a rotary screen printing press that performs printing, coating, or the like by supplying liquid, such as ink or varnish, to a sheet or a web through holes in a cylindrically-shaped screen plate by use of a squeegee.

BACKGROUND ART

A printing press that can perform screen printing, offset printing, and intaglio printing on the same sheet has been disclosed heretofore as a printing press capable of rotary screen printing (see Patent Document 1 below). A configuration for throwing a squeegee on and off a screen cylinder formed of a cylindrically-shaped screen plate has also been disclosed (see Patent Document 2 below).

PRIOR ART DOCUMENT

Patent Document

Patent Document 1: Japanese Patent Application Publication No. 2014-100819
Patent Document 2: Japanese Patent No. 5337358

SUMMARY OF THE INVENTION

Problems to be Solved by the Invention

A screen plate is thin and therefore may be damaged if a squeegee contacts the screen plate with a screen cylinder not in contact with an impression cylinder.

Figure 7:
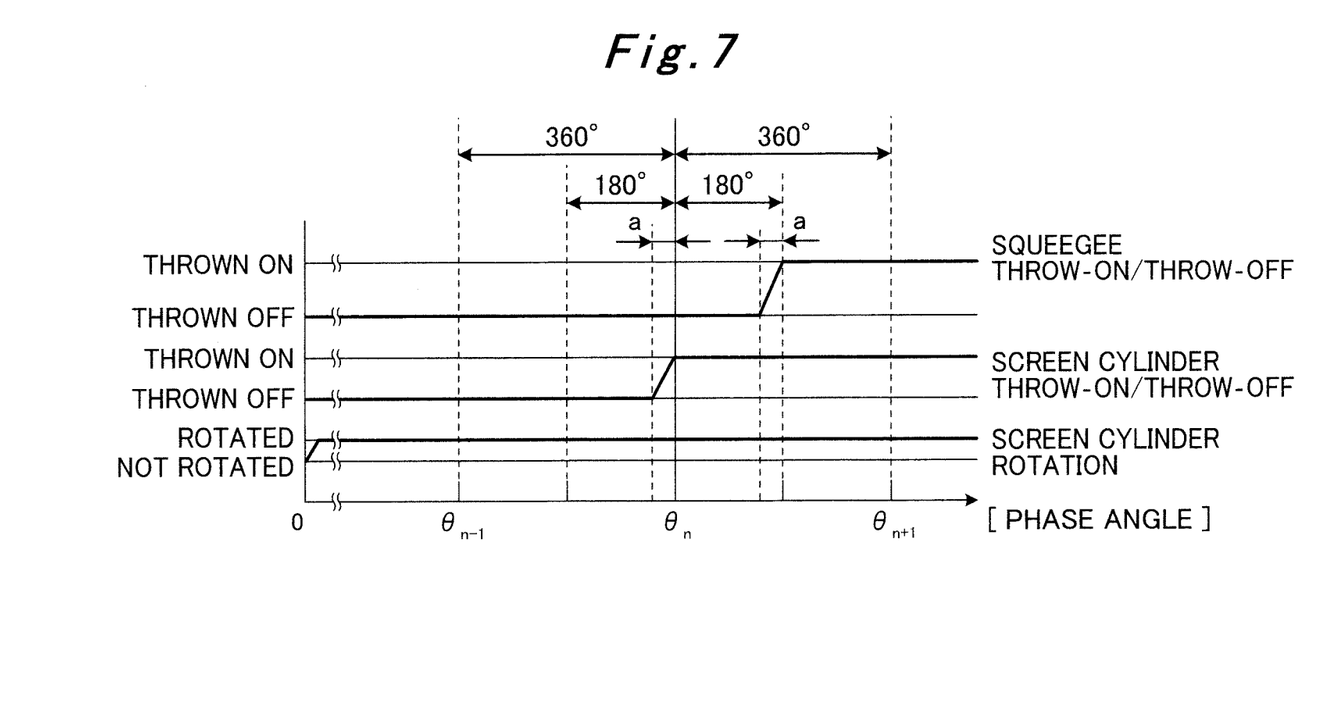
FIG. 7 is an explanatory diagram chronologically showing an example of how a screen cylinder and a squeegee are controlled at the start of printing by a conventional rotary screen printing press.

For this reason, a conventional rotary screen printing press, like the one described above, performs screen printing as follows. At the start of printing, as shown in FIG. 7, the screen cylinder is thrown on (brought into contact with) the impression cylinder according to the timing when a sheet is transported. After this throw-on action is confirmed and then the screen cylinder makes one rotation, the squeegee is thrown on (brought into contact with) the screen plate.

Figure 8:
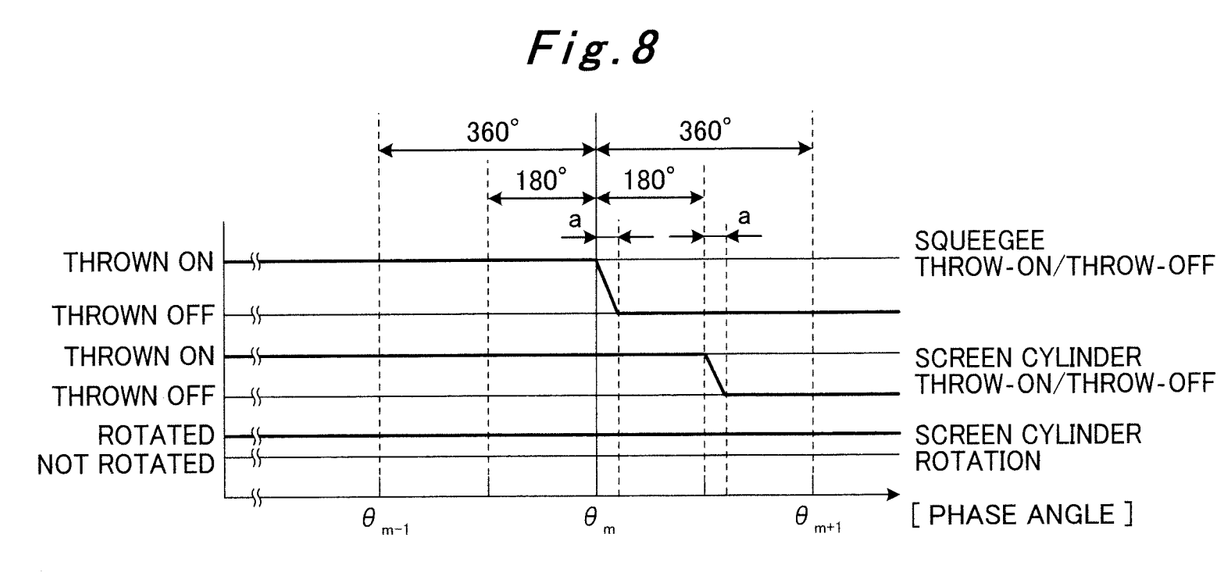
FIG. 8 is an explanatory diagram chronologically showing an example of how the screen cylinder and the squeegee are controlled at the end of printing by the conventional rotary screen printing press.

At the end of the printing, as shown in FIG. 8, after the last sheet is printed, the squeegee is thrown off (brought out of contact with) the screen plate. After this throw-off action is confirmed and then the screen cylinder makes one rotation, the screen cylinder is thrown off (brought out of contact with) the impression cylinder. Screen printing is thus ended. It is necessary in this event to keep transporting the sheet even after the throw-off action of the squeegee so that ink may not be set off on the impression cylinder.

In this way, to prevent the screen plate from being damaged by the squeegee coming into contact with the screen plate not in contact with the impression cylinder, the throw-on action of the squeegee is started after the throw-on action of the screen cylinder is confirmed to be completed, and the throw-off action of the screen cylinder is started after the throw-off action of the squeegee is confirmed to be completed. This produces wasted sheets at the start and end of the printing.

To overcome such a problem, the present invention aims to provide a rotary screen printing press capable of reducing wasted sheets.

Means for Solving the Problems

A rotary screen printing press according to a first aspect of the invention aiming to solve the above problem includes an impression cylinder that retains and transports a sheet,
a screen cylinder formed of a screen plate shaped cylindrically,
a squeegee retained inside the screen cylinder,
screen-cylinder throw-on/off motors that move the screen cylinder via screen cylinder devices to bring the screen cylinder into and out of contact with the impression cylinder, the screen cylinder devices retaining the screen cylinder while allowing the screen cylinder to swing, and
squeegee throw-on/off motors that move the squeegee via squeegee devices to bring the squeegee into and out of contact with an inner circumferential surface of the screen plate, the squeegee devices retaining the squeegee while allowing the squeegee to swing, and
the rotary screen printing press is characterized in that the rotary screen printing press comprises:
a screen-cylinder position detector that detects a position of the screen cylinder;
a squeegee position detector that detects a position of the squeegee; and
a control unit that controls the screen cylinder throw-on/off motors and the squeegee throw-on/off motors based on the position of the screen cylinder detected by the screen-cylinder position detector and the position of the squeegee detected by the squeegee position detector so that the squeegee does not contact the screen plate except when the screen cylinder is in contact with the impression cylinder.

A rotary screen printing press according to a second aspect of the invention is according to the first aspect of the invention and is characterized in that
the control unit controls the screen cylinder throw-on/off motors and the squeegee throw-on/off motors so that, within a period when the screen cylinder and a certain notched portion in the impression cylinder face each other, either an action of throwing the screen cylinder on the screen cylinder and an action of throwing the squeegee on the screen plate are completed or an action of throwing the squeegee off the screen plate and an action of throwing the screen cylinder off the impression cylinder are started.

Effect of the Invention

The rotary screen printing press according to the present invention can reduce wasted sheets because, at the start of printing, screen printing can be performed normally from the first sheet supplied, and at the end of the printing, no sheet needs to be supplied after the last sheet is printed.

MODE FOR CARRYING OUT THE INVENTION

Hereinbelow, a rotary screen printing press according to the present invention is described with reference to the drawings. It goes without saying that the rotary screen printing press according to the present invention is not limited to the following embodiment, and can be variously modified without departing from the gist of the present invention.

Embodiment

A rotary screen printing press according to an embodiment is described in detail below with reference to FIGS. 1 to 6.

Figure 1:
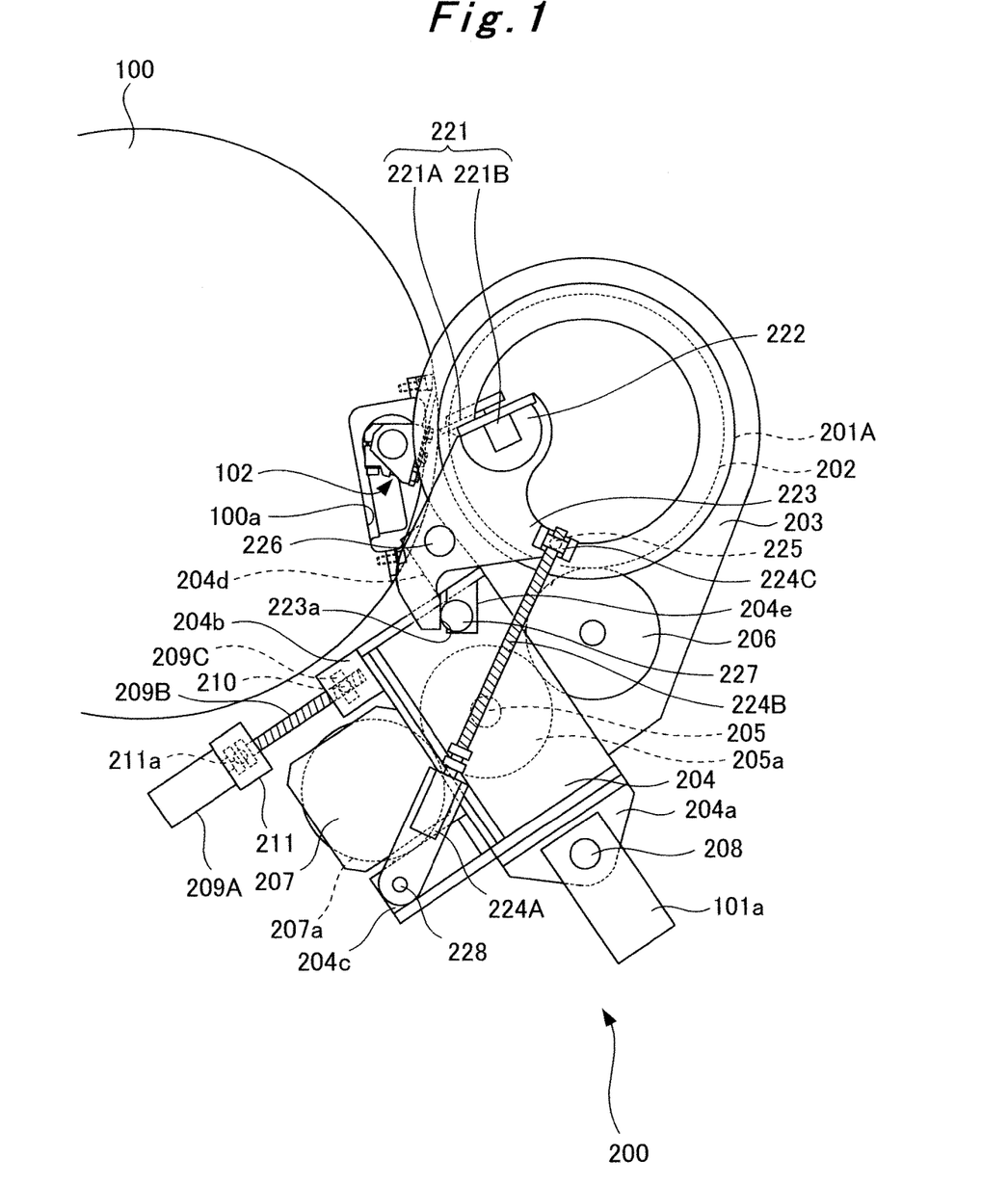
FIG. 1 is an explanatory diagram illustrating a rotary screen printing press according to Embodiment 1 of the present invention.
Figure 2:
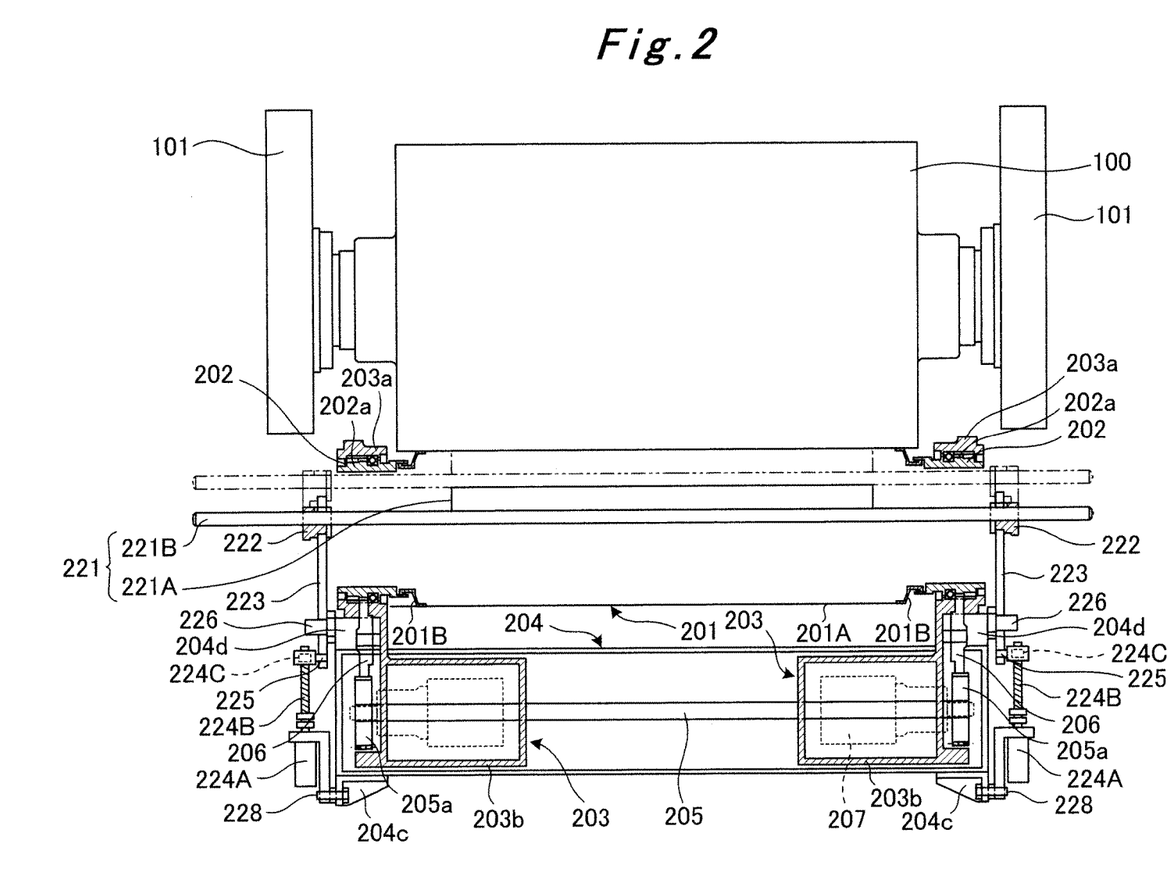
FIG. 2 is an exploded plan view showing part of FIG. 1 in an exploded manner.

As shown in FIGS. 1 and 2, in this embodiment, an impression cylinder 100 that retains and transports a sheet (an article to be printed) is turnably supported between left and right mechanical frames 101, 101, and a screen cylinder 201 is disposed at a position facing the impression cylinder 100.

The impression cylinder 100 has notched portions 100a formed in the outer circumference surface thereof at positions facing each other with the axial center of the impression cylinder 100 interposed therebetween. A retention device 102 configured to retain and release a sheet is disposed in each notched portion 100a. In this embodiment, the cylinder diameter of the impression cylinder 100 is twice as long as that of the screen cylinder 201.

The screen cylinder 201 is formed of a screen plate 201A formed by a thin, cylindrically-shaped screen material into which small holes representing a design pattern are etched, and two end rings 201B, 201B secured to the respective edges (left and right edges in FIG. 2) of the screen plate 201A to reinforce the screen plate 201A. The screen cylinder 201 is supported by the frames 101, 101 via bearing members 202, 202, screen brackets 203, 203, and a sub-frame 204.

The end rings 201B are detachably supported by the bearing members 202, which are turnably supported by the screen brackets 203.

The screen brackets 203 are each formed of a screen support portion 203a by which the corresponding bearing member 202 is turnably supported and a rotary shaft support portion 203b disposed radially outward of the screen cylinder 201 relative to the screen support portion 203a.

A rotary shaft 205 paralleling the direction of the axis of the screen cylinder 201 is turnably supported at its ends by the respective rotary shaft support portions 203b.

Each end of the rotary shaft 205 is provided with a gear 205a which, via an intermediate gear 206, meshes with a gear 202a formed on the outer circumferential surface of the corresponding bearing member 202. The gear 205a on one of the ends of the rotary shaft 205 (the right end in FIG. 2) meshes with a gear 207a of a screen-cylinder drive motor 207 (see FIG. 1).

Thus, when the screen-cylinder drive motor 207 is driven, power of the screen-cylinder drive motor 207 is transmitted to one end of the screen cylinder 201 (the right end in FIG. 2) via the gear 207a of the screen-cylinder drive motor 207, the gear 205a of the rotary shaft 205 on the one end, one of the intermediate gears 206 (the right one in FIG. 2), the gear 202a of one of the bearing members 202 (the right one in FIG. 2), and the one bearing member 202. The power of the screen-cylinder drive motor 207 is also transmitted to the other end of the screen cylinder 201 (the left end in FIG. 2) via the gear 207a of the screen-cylinder drive motor 207, the gear 205a of the rotary shaft 205 on the one end, the rotary shaft 205, the gear 205a of the rotary shaft 205 on the other end (the left end in FIG. 2), the other intermediate gear 206 (the left one in FIG. 2), the gear 202a of the other bearing member 202 (the left one in FIG. 2), and the other bearing member 202. Thereby, both ends of the screen cylinder 201 are rotationally driven by the screen-cylinder drive motor 207.

The sub-frame 204 is disposed to extend in the direction of the axis of the screen cylinder 201, and supports the rotary shaft support portions 203b of the screen brackets 203, 203.

Figure 3A:
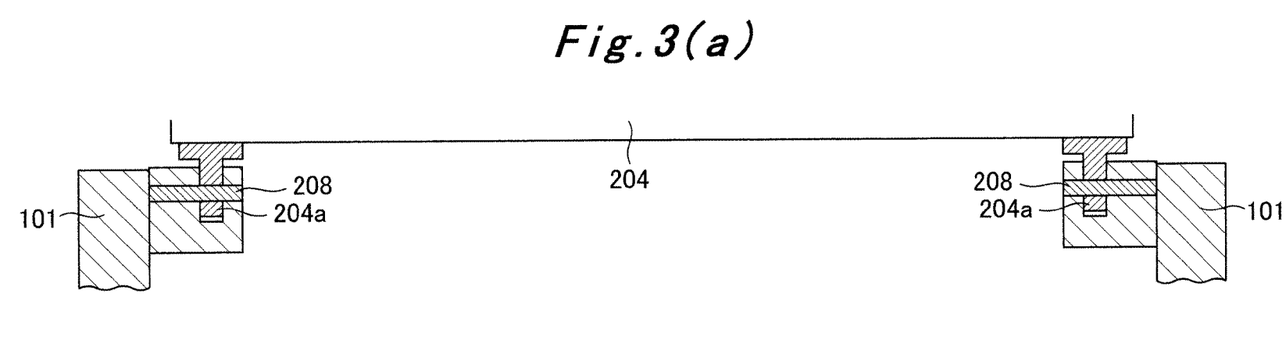
FIG. 3(a) is an explanatory diagram showing the relation between frames and a sub-frame.

The sub-frame 204 has first coupling brackets 204a formed at respective axial end portions thereof, and as shown in FIG. 3(a), the first coupling brackets 204a are swingably supported by the mechanical frames 101 via pins 208 secured to the mechanical frames 101, respectively.

Figure 3B:
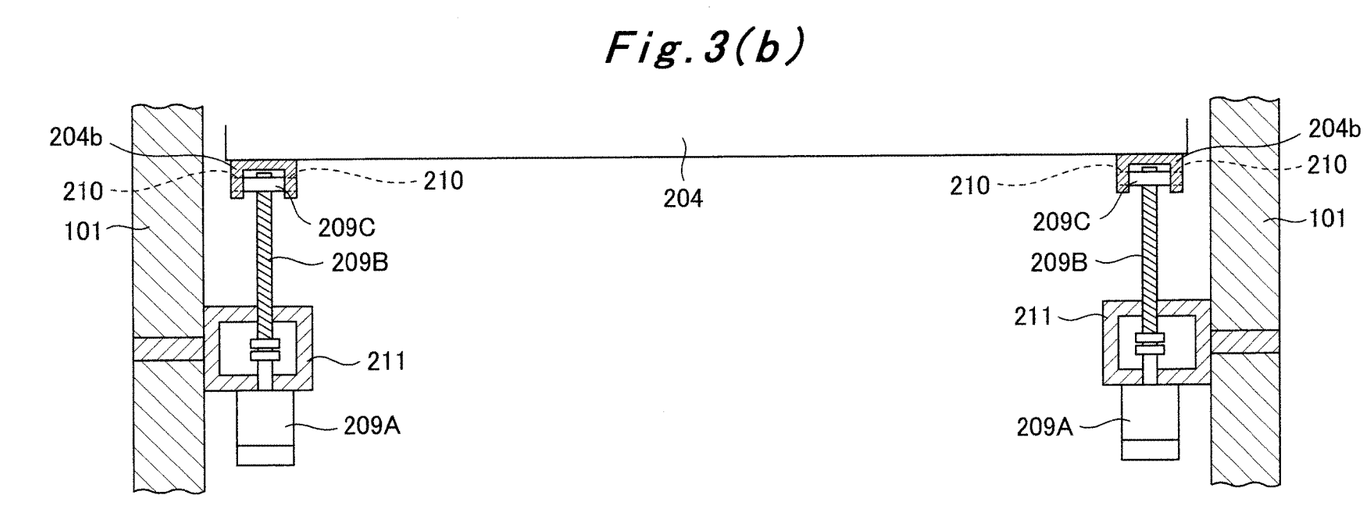
FIG. 3(b) is an explanatory diagram showing the relation among the frames, the sub-frame, and screen-cylinder throw-on/off motors.

The sub-frame 204 has second coupling brackets 204b formed respectively at axial end portions thereof, and as shown in FIG. 3(b), a threaded shaft 209B is swingably connected to each of the second coupling brackets 204b, the threaded shaft 209B being coupled to the motor shaft of a screen-cylinder throw-on/off motor 209A. To be more specific, each threaded shaft 209B is swingably coupled to the corresponding second coupling bracket 204b via a pin 210 provided to a nut member 209C screwed onto the threaded shaft 209B. When the screen-cylinder throw-on/off motor 209A is rotated to rotate the threaded shaft 209B, the nut member 209C advances and retreats in the direction of the axis of the threaded shaft 209B by means of a feed screw mechanism.

The screen-cylinder throw-on/off motors 209A are provided to bring the screen cylinder 201 (or more specifically the screen plate 201A) into and out of contact with the impression cylinder 100, and a main portion of each of the screen-cylinder throw-on/off motors 209A is swingably secured to a corresponding one of the left and right mechanical frames 101 via a screen-cylinder throw-on/off motor support member 211.

As shown in FIGS. 1 and 2, a squeegee 221 is retained inside the screen cylinder 201. The squeegee 221 includes a blade (squeegee main body) 221A that supplies ink on the inner side of the screen plate 201A to the impression cylinder 100 side through the small holes in the screen plate 201A, and a squeegee bar 221B serving as a support body that supports the blade 221A.

Both ends of the squeegee 221 are swingably supported by the sub-frame 204 via squeegee support members 222, 222 and support plates 223, 223, respectively.

The squeegee support members 222 support the squeegee bar 221B while allowing the squeegee bar 221B to swing.

Each of the support plates 223 is a plate body that retains the corresponding squeegee support member 222 at a certain area thereof. A threaded shaft 224B is swingably coupled to another area of the support plate 223, the threaded shaft 224B being coupled to the motor shaft of a corresponding one of squeegee throw-on/off motors 224A. Still another area of the support plate 223 is swingably and pivotally supported by a pin 226. The support plate 223 includes a contact surface 223a that contacts a pin 227. The threaded shaft 224B is swingably coupled to the support plate 223 via a pin 225 provided to a nut member 224C screwed onto the threaded shaft 224B. When the squeegee throw-on/off motor 224A is rotated to rotate the threaded shaft 224B, the nut member 224C advances and retreats in the direction of the axis of the threaded shaft 224B by means of a feed screw mechanism.

The squeegee throw-on/off motors 224A are provided to bring the squeegee 221 (or more specifically the blade 221A) into and out of contact with the inner circumferential surface of the screen plate 201A, and are swingably supported respectively by third coupling brackets 204c, which are formed on axial end portions of the sub-frame 204, via pins 228.

The pins 226 are secured respectively to fourth coupling brackets 204d formed at axial end portions of the sub-frame 204, and the pins 227 are secured respectively to fifth coupling brackets 204e formed on axial end portions of the sub-frame 204.

Figure 4:
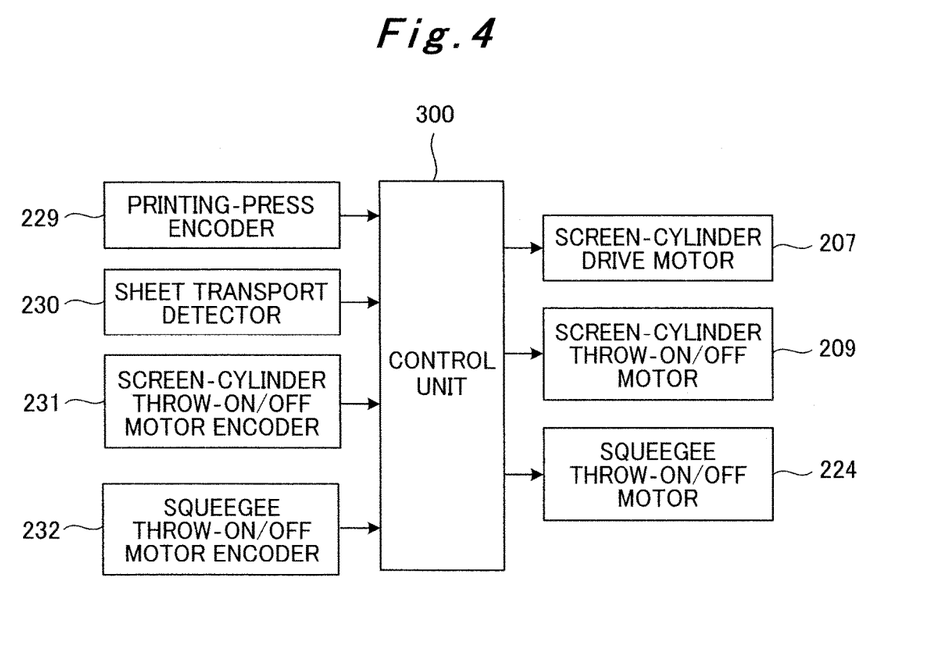
FIG. 4 is a block diagram showing the control configuration of the rotary screen printing press according to Embodiment 1 of the present invention.

Next, a description is given of a control unit of the rotary screen printing press according to the embodiment. As shown in FIG. 4, a control unit 300 of the rotary screen printing press according to the embodiment receives a signal outputted by a printing-press encoder 229 provided in the impression cylinder 100, a signal outputted by a sheet transport detector 230 provided on the feeder board of a sheet feeder (not shown) to detect a sheet fed to the feeder board one at a time, signals outputted by screen-cylinder throw-on/off motor encoders 231 provided to the screen-cylinder drive motor 207, and signals outputted by squeegee throw-on/off motor encoders 232 provided to the squeegee throw-on/off motors 224A, and thereby controls and drives the screen-cylinder drive motor 207, the screen-cylinder throw-on/off motors 209A, and the squeegee throw-on/off motors 224A.

Figure 5:
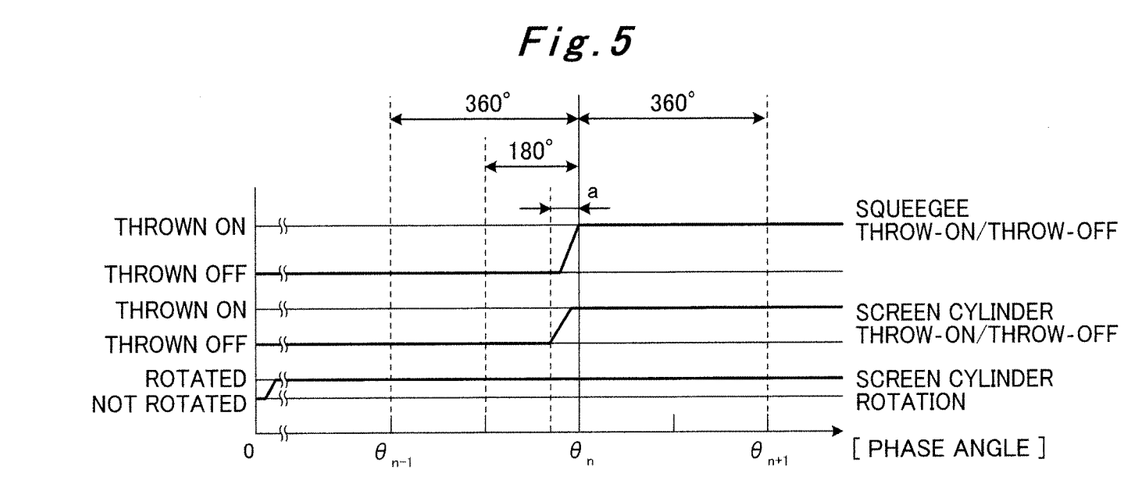
FIG. 5 is an explanatory diagram chronologically showing an example of how a screen cylinder and a squeegee are controlled at the start of printing by the rotary screen printing press according to the embodiment of the present invention.
Figure 6:
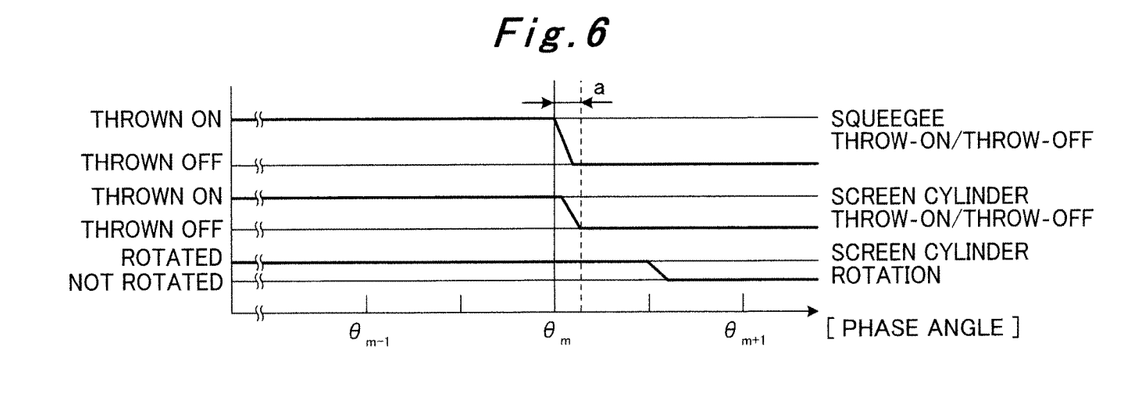
FIG. 6 is an explanatory diagram chronologically showing an example of how the screen cylinder and the squeegee are controlled at the end of printing by the rotary screen printing press according to the embodiment of the present invention.

The following describes, with reference to FIGS. 5 and 6, how the control unit 300 according to the embodiment controls the screen cylinder 201 and the squeegee 221. Note that, in FIGS. 5 and 6, one rotation of the impression cylinder 100 (for example, from $\theta_{n-1}$ (or $\theta_{m-1}$) to $\theta_n$ (or $\theta_m$) and from $\theta_n$ (or $\theta_m$) to $\theta_{n+1}$ (or $\theta_{m+1}$)) is 360°, and one rotation of the screen cylinder 201 is 180°.

First, as shown in FIG. 5, before print operation is started by the rotary screen printing press of the embodiment, the screen cylinder 201 is in a screen-cylinder throw-off position at which the screen cylinder 201 is out of contact with the impression cylinder 100, and the squeegee 221 is in a squeegee throw-off position at which an edge of the blade 221A is out of contact with the inner circumferential surface of the screen plate 201A.

To start the print operation, the control unit 300 rotationally drives the screen-cylinder drive motor 207 based on the sheet transport status determined from a signal inputted from the printing-press encoder 229 (herein, the phase of the impression cylinder 100, containing its speed) and a signal inputted from the sheet transport detector 230, at such timing that ink may be sufficiently spread over the inner circumferential surface of the screen plate 201A by the time of phase angle $\theta_n$ at which the first sheet retained by the retention device 102 disposed in the notched portion 101a faces the screen cylinder 201.

Thereafter, based on the sheet transport status determined from a signal inputted from the printing-press encoder 229 and a signal inputted from the sheet transport detector 230, the control unit 300 drives the screen-cylinder throw-on/off motors 209A to rotate the threaded shafts 209B to move the nut members 209C and drives the squeegee throw-on/off motors 224A to rotate the threaded shafts 224B to move the nut members 224C, so that within the period when the notched portion 101a accommodating the retention device 102 retaining the first sheet is facing the screen cylinder 201 (during a notch range a shown in FIG. 5), the screen cylinder 201 may be brought into a screen-cylinder throw-on position at which the screen cylinder 201 comes into contact with the impression cylinder 100 and the squeegee 221 may be brought into a squeegee throw-on position at which the edge of the blade 221A comes into contact with the inner circumferential surface of the screen plate 201A.

As a result, the entire sub-frame 204 swings about the pins 208 in such a direction as to move the screen cylinder 201 toward the impression cylinder 100 (counterclockwise in FIG. 1), and the support plates 223 swing about the pins 226 in such a direction as to move the squeegee 221 toward the inner circumferential direction of the screen plate 201A (counterclockwise in FIG. 1).

In this event, based on signals inputted from the screen-cylinder throw-on/off motor encoders 231 and the squeegee throw-on/off motor encoders 232, the control unit 300 controls and drives the screen-cylinder throw-on/off motors 209A and the squeegee throw-on/off motors 224A simultaneously so that the screen cylinder 201 and the squeegee 221 may not contact each other.

Then, the control unit 300 stops the screen-cylinder throw-on/off motors 209A when detecting that the screen cylinder 201 is in the screen-cylinder throw-on position, and stops the squeegee throw-on/off motors 224A when detecting that the squeegee 221 is in the squeegee throw-on position.

By such control, just as the screen cylinder 201 and the squeegee 221 have moved into their respective throw-on positions (the phase angle $\theta_n$ in FIG. 5), the first sheet is transported to a position between the impression cylinder 100 and the screen plate 201A, and ink is pushed out by the squeegee 221 through the holes penetrating the screen surface of the screen plate 201A and is transferred to the first sheet.

Then, as shown in FIG. 6, after the last sheet is printed, based on the sheet transport status determined from a signal inputted from the printing-press encoder 229 and a signal inputted from the sheet transport detector 230, the control unit 300 drives the squeegee throw-on/off motors 224A to rotate the threaded shafts 224B to move the nut members 224C and drives the screen-cylinder throw-on/off motors 209A to rotate the threaded shafts 209B to move the nut members 209C, so that the squeegee 221 may be brought out of contact with the screen cylinder 201 and the screen cylinder 201 may be brought out of contact with the impression cylinder 100, within the period from when the notched portion 101a accommodating the retention device 102 which is the one next to the retention device 102 retaining the last sheet starts facing the screen cylinder 201 at the phase angle $\theta_m$ to when the notched portion 101a finishes facing the notched portion 101a (a notch range a shown in FIG. 6).

As a result, the support plates 223 swing about the pins 226 in such a direction as to move the squeegee 221 away from the inner circumferential surface of the screen plate 201A (clockwise in FIG. 1), and the entire sub-frame 204 swings about the pins 208 in such a direction as to move the screen cylinder 201 away from the impression cylinder 100 (clockwise in FIG. 1).

In this event, based on signals inputted from the screen-cylinder throw-on/off motor encoders 231 and the squeegee throw-on/off motor encoders 232, the control unit 300 controls and drives the squeegee throw-on/off motors 224A and the screen-cylinder throw-on/off motors 209A simultaneously so that the screen cylinder 201 and the squeegee 221 may not contact each other.

Then, the control unit 300 stops the squeegee throw-on/off motors 224A when detecting that the squeegee 221 is in the squeegee throw-off position based on signals inputted from the squeegee throw-on/off motor encoders 232, and stops the screen-cylinder throw-on/off motors 209A when detecting that the screen cylinder 201 is in the screen-cylinder throw-off position based on signals inputted from the screen-cylinder throw-on/off motor encoders 231.

In this embodiment, the bearing members 202, the screen brackets 203, and the sub-frame 204 form a screen cylinder device, and the squeegee support members 222 and the support plates 223 form a squeegee device. Further, the screen-cylinder throw-on/off motor encoders 231 form a screen-cylinder position detector, and the squeegee throw-on/off motor encoders 232 form a squeegee position detector.

Conventionally, after the screen cylinder 201 is brought into contact with the impression cylinder 100, the squeegee 221 is not brought into contact with the inner circumferential surface of the screen plate 201A until the screen cylinder 201 makes one rotation. By contrast, in the rotary screen printing press according to the embodiment set forth above, the screen-cylinder throw-on/off motors 209A and the squeegee throw-on/off motors 224A control the throw-on actions of the screen cylinder 201 and the squeegee 221 with high accuracy as follows. Specifically, immediately before printing starts, within the period when the notched portion 100a of the impression cylinder 100 is facing the screen cylinder 201, the screen cylinder 201 and the squeegee 221 are brought into their respective throw-on positions without contacting each other based on signals inputted from the screen-cylinder throw-on/off motor encoders 231 and the squeegee throw-on/off motor encoders 232.

At the end of the printing, conventionally, after the squeegee 221 is brought out of contact with the inner circumferential surface of the screen plate 201A, the screen cylinder 201 is not brought out of contact with the impression cylinder 100 until the screen cylinder 201 makes one rotation. By contrast, the screen-cylinder throw-on/off motors 209A and the squeegee throw-on/off motors 224A control the throw-off actions of the screen cylinder 201 and the squeegee 221 with high accuracy as follows. Specifically, immediately after the printing ends, within the period when the notched portion 100a of the impression cylinder 100 is facing the screen cylinder 201, the screen cylinder 201 and the squeegee 221 are brought into their respective throw-off positions without contacting each other based on signals inputted from the squeegee throw-on/off motor encoders 232 and the screen-cylinder throw-on/off motor encoders 231.

Thus, at the start of the printing, screen printing can be performed normally from the first sheet, and at the end of the printing, a sheet does not need to be transported after the last sheet is printed. This reduces wasted sheets.

In the example described in the embodiment, the squeegee 221 is supported via the support plates 223 swingably supported by the sub-frame 204 supporting the screen cylinder 201. Alternatively, the screen cylinder 201 and the squeegee 221 may be supported by the frames 101 independently of each other.

In the example described in the embodiment, the screen-cylinder throw-on/off motor encoders 231 and the squeegee throw-on/off motor encoders 232 are used as a screen-cylinder position detector and a squeegee position detector, respectively. However, the present invention is not limited to the embodiment described above. For example, a photoelectric sensor that detects the position of the bearing members 202, the screen brackets 203, or the sub-frame 204 may be used as the screen-cylinder position detector, and a photoelectric sensor that detects the position of the support plates 223 may be used as the squeegee position detector.

Moreover, the timing for the screen cylinder 201 and the squeegee 221 to start moving for the throw-on actions and the timing for the screen cylinder 201 and the squeegee 221 to be brought into the standby positions for the throw-off operations do not need to fall within the notch ranges a shown in FIGS. 5 and 6.

INDUSTRIAL APPLICABILITY

The present invention can be advantageously applied to a rotary screen printing press.

REFERENCE SIGNS LIST 100 impression cylinder
100a notched portion
101 mechanical frame
102 retention device
201 screen cylinder
201A screen plate
201B end ring
202 bearing member
202a gear on bearing member
203 screen bracket
203a screen support portion
203b rotary shaft support portion
204 sub-frame
204a first coupling bracket
204b second coupling bracket
204c third coupling bracket
204d fourth coupling bracket
204e fifth coupling bracket
205 rotary shaft
205a gear on rotary shaft
206 intermediate gear
207 screen-cylinder drive motor
207a gear on drive motor
208 pin
209A screen-cylinder throw-on/off motor
209B threaded shaft
209C nut member
210 pin
211 screen-cylinder throw-on/off motor support member
221 squeegee
221A blade
221B squeegee bar
222 squeegee support member
223 support plate 223a contact surface
224A squeegee throw-on/off motor
224B threaded shaft
224C nut member
225, 226, 227, 228 pin
229 printing-press encoder
230 sheet transport detector
231 screen-cylinder throw-on/off motor encoder
232 squeegee throw-on/off motor encoder
300 control unit The invention claimed:

1. A rotary screen printing press including an impression cylinder that retains and transports a sheet,
   a screen cylinder formed of a cylindrically-shaped screen plate,
   a squeegee retained inside the screen cylinder,
   screen-cylinder throw-on/off motors that move the screen cylinder via screen cylinder devices to bring the screen cylinder into and out of contact with the impression cylinder, the screen cylinder devices retaining the screen cylinder while allowing the screen cylinder to swing, and
   squeegee throw-on/off motors that move the squeegee via squeegee devices to bring the squeegee into and out of contact with an inner circumferential surface of the screen plate, the squeegee devices retaining the squeegee while allowing the squeegee to swing,
   characterized in that the rotary screen printing press comprises:
   a screen-cylinder position detector that detects a position of the screen cylinder;
   a squeegee position detector that detects a position of the squeegee; and
   a control unit that controls the screen cylinder throw-on/off motors and the squeegee throw-on/off motors based on the position of the screen cylinder detected by the screen-cylinder position detector and the position of the squeegee detected by the squeegee position detector so that the squeegee does not contact the screen plate except when the screen cylinder is in contact with the impression cylinder.

2. The rotary screen printing press according to claim 1, characterized in that
   the control unit controls the screen cylinder throw-on/off motors and the squeegee throw-on/off motors so that, within a period when the screen cylinder and a certain notched portion in the impression cylinder face each other, either an action of throwing the screen cylinder on the impression cylinder and an action of throwing the squeegee on the screen plate are completed, or an action of throwing the squeegee off the screen plate and an action of throwing the screen cylinder off the impression cylinder are started.

* * * * *